United States Patent
Anutgan et al.

(10) Patent No.: US 9,012,252 B2
(45) Date of Patent: Apr. 21, 2015

(54) METHOD FOR MANUFACTURING A LIGHT EMITTING DIODE

(76) Inventors: Mustafa Anutgan, Ankara (TR); Bayram Katircioglu, Ankara (TR); Tamila Anutgan, Ankara (TR); Ismail Atilgan, Ankara (TR)

( * ) Notice: Subject to any disclaimer, the term of this patent is extended or adjusted under 35 U.S.C. 154(b) by 32 days.

(21) Appl. No.: 13/992,759

(22) PCT Filed: Nov. 2, 2011

(86) PCT No.: PCT/TR2011/000236
§ 371 (c)(1), (2), (4) Date: Jun. 10, 2013

(87) PCT Pub. No.: WO2010/078119
PCT Pub. Date: Jun. 14, 2012

(65) Prior Publication Data
US 2013/0260500 A1    Oct. 3, 2013

(30) Foreign Application Priority Data

Dec. 10, 2010 (TR) ............................... a 2010 10339
Dec. 20, 2010 (TR) ............................... a 2010 10644

(51) Int. Cl.
*H01L 33/00* (2010.01)
*H01L 27/32* (2006.01)

(52) U.S. Cl.
CPC .............. *H01L 33/005* (2013.01); *H01L 27/32* (2013.01); *H01L 33/0012* (2013.01); *H01L 33/0058* (2013.01); *H01L 33/0095* (2013.01)

(58) Field of Classification Search
CPC ..... H01L 27/15; H01L 27/3206; H01L 33/30; H01L 31/055; H01L 27/32; H01L 27/3211
USPC ....... 438/22, 29, 35, 70, 79; 257/98, E33.061
See application file for complete search history.

(56) References Cited

U.S. PATENT DOCUMENTS

| 4,987,460 A * | 1/1991 | Takasu et al. ................ 257/103 |
| 2005/0199896 A1 * | 9/2005 | Kaneko et al. ................ 257/96 |

OTHER PUBLICATIONS

Yeh et al. "optoelectronic Characteristics of Direct-current and Alternating-Current white Thin-Film - - - ", Apr. 2008.*

* cited by examiner

*Primary Examiner* — Su C Kim
(74) *Attorney, Agent, or Firm* — Gokalp Bayramoglu

(57) ABSTRACT

This invention is about a method to be used in the fabrication of an electroluminescent diode and a diode fabricated with this method. The temperatures needed for the crystalline LEDs produced presently under specified temperatures in a furnace, will be provided within the semiconductor by the Joule effect. As an alternative to the commercial LEDs, whose costs are suitable only when they are produced in the order of centimeters, our process renders the fabrication of LEDs over very large surfaces of the order of meters, with the temperature raised by applying electric current without any requirements of high temperature furnace treatments. The effects of the chemical processes experienced during the Joule heating are permanent and the diode is able to luminesce.

1 Claim, 3 Drawing Sheets

| Diode# | Intrinsic film | Gases (sccm) | | | | Substrate T (K) |
|---|---|---|---|---|---|---|
| | | SiH$_4$ | H$_2$ | NH$_3$ | Total | |
| D0 | a-Si:H | 10 | 50 | 0 | 60 | 473 |
| D1 | a-SiN$_x$:H | 10 | 0 | 20 | 30 | 523 |
| D2 | a-SiN$_x$:H | 10 | 0 | 40 | 50 | 523 |
| D3 | a-SiN$_x$:H | 5 | 0 | 45 | 50 | 523 |

METHOD FOR MANUFACTURING A LIGHT EMITTING DIODE

FIELD OF THE INVENTION

This invention is about a method to be used in the fabrication of an electroluminescent diode and a diode fabricated with this method.

BACKGROUND OF THE INVENTION

Using the current diode fabrication methods, the production of macroscale LEDs is almost impossible by means of the furnace annealing processes and other costs. One known in the state of the art is explained in the patent application WO2004107419. In the mentioned application, p-i-n layers are used in a LED.

BRIEF DESCRIPTION OF THE INVENTION

The temperatures needed for the crystalline LEDs produced presently under specified temperatures in a furnace, will be provided within the semiconductor by the Joule effect. As an alternative to the commercial LEDs, whose costs are suitable only when they are produced in the order of centimeters, our process renders the fabrication of LEDs over very large surfaces of the order of meters, with the temperature raised by applying electric current without any requirements of high temperature furnace treatments. The effects of the chemical processes experienced during the Joule heating are permanent and the diode is able to luminesce. Since the wavelength of the light emitted from the LED can be adjusted by changing the "x" value in the hydrogenated amorphous silicon nitride (a-$SiN_x$:H), the production of LED for any desired color is possible.

DESCRIPTION OF THE DRAWINGS

The diode, produced to reach the aim of this invention, is presented in the attached figures; these figures being.

DETAILED DESCRIPTION OF THE INVENTION

The production method of the diode:

Coating of the 1 mm thick glass substrate with chromium,

Growing of p type doped hydrogenated nanocrystalline silicon (nc-Si:H) on the chromium coated glass by plasma enhanced chemical deposition (PECVD), Without any interruptions in the PECVD process, only adjusting the chemical concentrations, the successive deposition of undoped (luminescent active region) amorphous silicon nitride (a-$SiN_x$:H) and the n type nc-Si:H, After this structure is taken out of the PECVD reactor, coating of ITO (Indium tin oxide) as the window electrode through which the emitted light will be extracted, Transformation of the fabricated pin diode by the application of high forward bias voltage on the diode.

Due to the nano-sized crystallization particularly within the undoped a-$SiN_x$:H layer, high current values were achieved and as a result, light emission in the visible region was observed.

The usage of amorphous silicon nitride in the active region allows the adjustment of the emission color from red to blue by changing the process gas flow ratios. The light is uniformly emitted through the whole diode surface produced. In other words, after the fabrication of the complete structure of ITO/n nc-Si:H/a-SiNx:H/a-nc-Si:H/Cr/glass, this optically poor diode could be converted into an efficient light source with the emission color adjustable from red to blue due to the initial gas flow parameters after it is exposed to internal transformation under 8 V-14 V forward bias voltage, i.e. crystallization in the form of dispersed nc-Si islands.

The duration of the transformation process of the fabrication method described above can take less than 2 seconds. The transformation rate depending on the magnitude of the applied forward bias voltage and the structure of the diode, can take a few minutes under low bias voltage.

Figure 1:
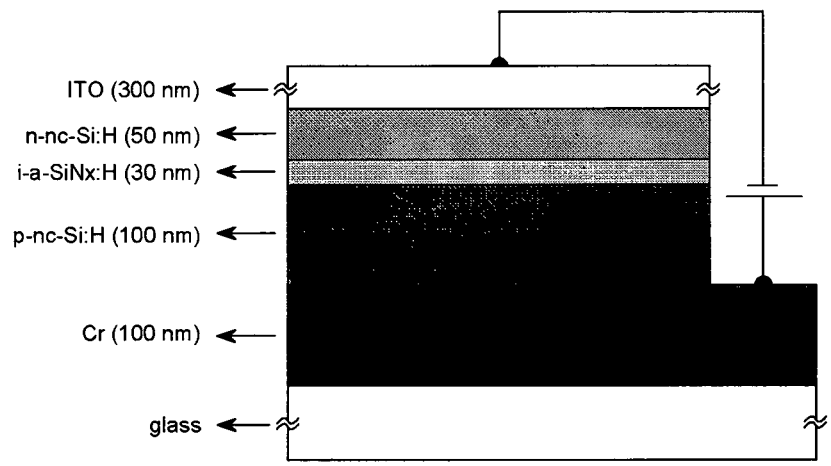
FIG. 1—The schematical cross section of the diode.
Figure 2:
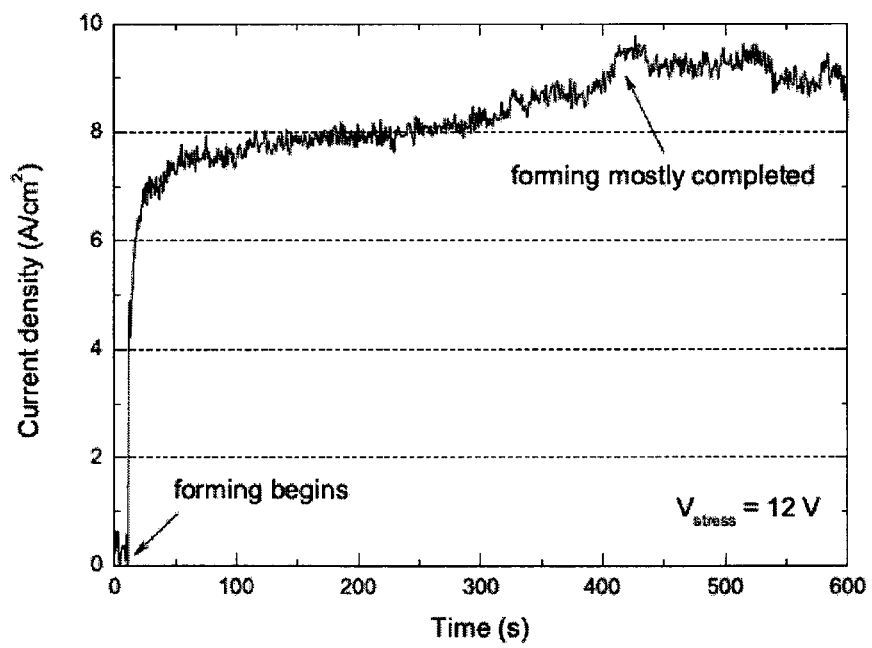
FIG. 2—The time evolution of the current density during the fabrication of the diode under high forward bias voltage.

The transformation process of a relatively slow transformed diode under low current density is as shown in FIG. 2. As seen in this figure, the transformation begins just after the bias voltage is applied. At this time, the current density drastically increases up to 6 A/$cm^2$ and the formed region is easily recognizable via the self-roughening of some portion of the ITO top electrode surface. The initial area of the formed diode portion depends on both the fabrication parameters and the applied voltage.

For the diode of FIG. 2, this area is usually more than half of the total diode area ($7.8 \times 10^{-3}$ $cm^2$) at voltage around 12 V. This phenomenon is accompanied with visible light emission from the transformed region. As time passes, the current density slightly increases and together with this, the area of the transformed portion slowly covers the whole diode surface. Finally, the whole diode is formed at about 400 seconds and the current density saturates at about 9 A/$cm^2$. Then, the visible light is uniformly emitted from the whole surface of the diode.

Figure 3:
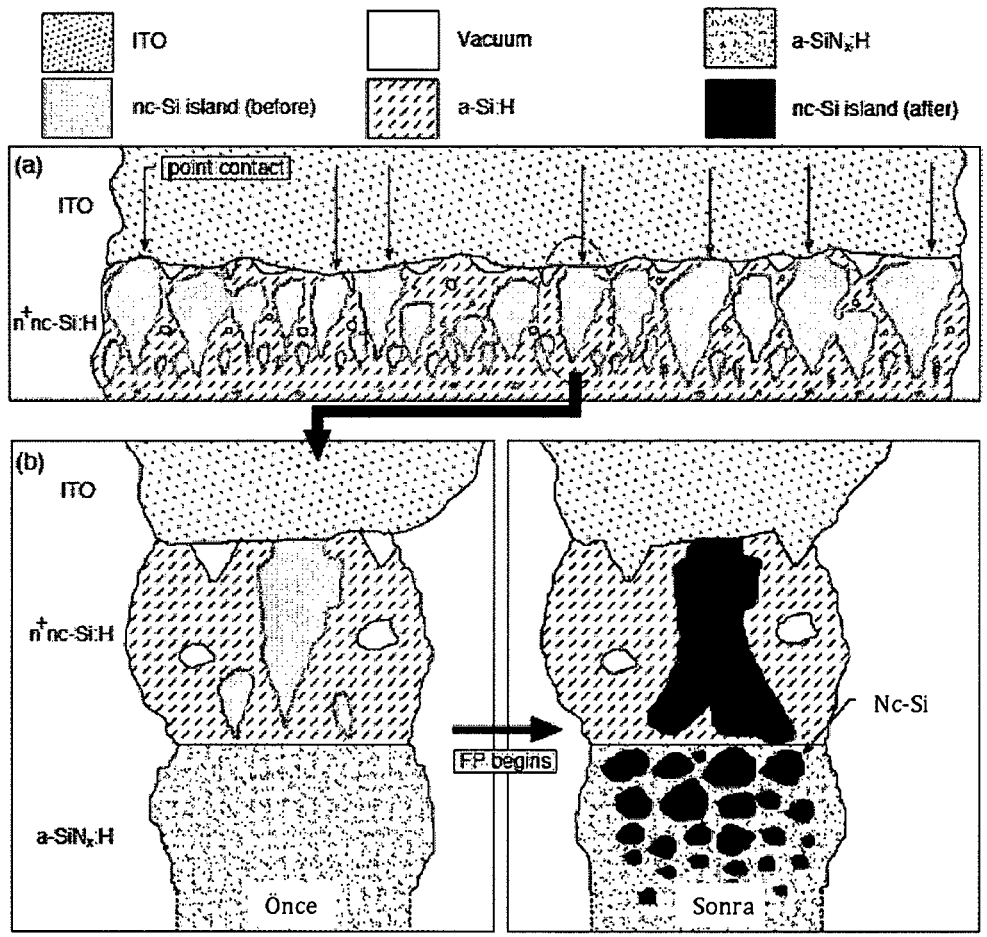
FIG. 3—The schematical representation of the nc-Si islands formed during the fabrication of the diode under the effect of the applied forwards bias voltage.
Figure 4:
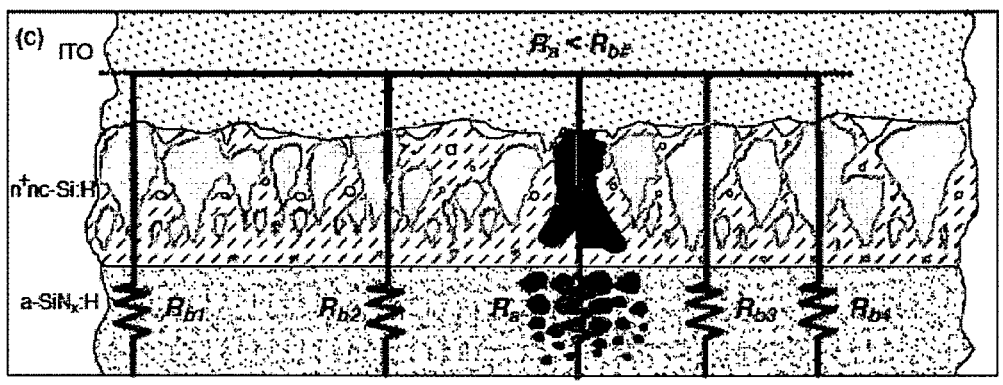
FIG. 4—The schematical representation of the current conduction paths created by the nc-Si islands during the fabrication of the diode.

Since the multi-atomic sputtered species of ITO at room temperature have very weak surface migration, their step coverage on the rough n nc-Si:H is not likely to be efficient. Therefore, the ITO/n nc-Si:H interface may be regarded as consisting of many point contacts indicated by arrows in FIG. 3. In addition, possible lateral non-uniformity along the pin structure may render some regions of the film more defective. Therefore, the actual current density through each contact point is not uniform. This microscopically non-uniform current density may cause non-uniform heating of the diode. At some voltage level (e.g. forward stress of 8 V), the local temperature at some of these regions rises so much to allow possible transformation from amorphous (higher energy) to crystalline (lower energy) phase of the amorphous Si islands present in the intrinsic layer. It has been proven by XRD measurements that, very high temperatures are attained during the transformation. The attained high temperatures are retained inside the low heat conductivity of the ITO electrode. The transformation process spreading over the whole surface of the diode only in which a material such as ITO that has a low heat conductivity is employed, is based on diffusing the Joule heat without leakage over the whole area of the diode.

The nc-Si:H grains produced by the transformation enhances both the mobility and the density of charge carriers when compared to the amorphous structure. Consequently, the conductivity of the formed region increases by several orders of magnitude.

Figures 5, 6:
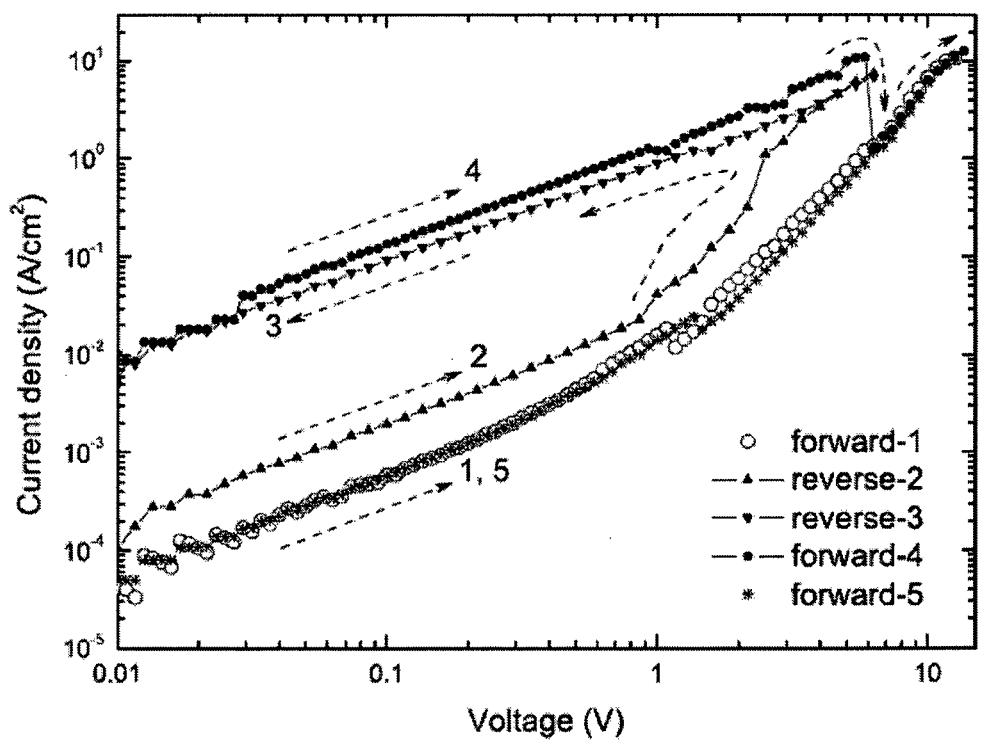
FIG. 5—A table showing embodiments of the diode under different chemical concentrations and temperatures.
FIG. 6—The current-voltage characteristics of the formed diode exhibiting a "memory effect".

Furthermore, the application of either forward or reverse bias creates a "memory effect" in the formed diode (FIG. 6). For instance, after the application of forward bias, with subsequent reverse bias the diode exhibits identical characteristics to the forward bias characteristics up to a particular voltage value. Similarly, after the application of reverse bias, with subsequent forward bias the diode exhibits identical characteristics to the reverse bias characteristics up to a particular voltage value. At the particular forward voltage at which the "memory effect" ceases, the diode characteristics switches immediately (in the order of seconds) and regains its original forward voltage behavior, starts to emit light. In addition to its light emission applications, this behavior of the diode will make possible the fabrication of light emitting memory devices.

LED arrays fabricated by this method on 30×30 cm$^2$ plates might be used as the lighting elements inside/outside the buildings, floors and ceilings. In addition, this method with more advanced equipment than those used in the initial experiments, plate LEDs with increased emission intensity and different regional color emissions can be achieved. In this form, it can be used in traffic signs and large scale alphanumeric indicators.

The fabrication steps of the diode include:
1. The luminescent active layer a-SiN$_x$:H should be sandwiched between the p$^+$- and n$^+$-type doped nc-Si:H opposite charge injector layers of the pin diode.
2. ITO window electrode should be used in order to keep the heat produced by the Joule effect within the structure.
3. As a consequence of the Joule heating, crystallization of nano-sized a-Si:H islands would occur within the structure.
4. The emission color could be adjusted by adjusting the nitrogen content of the a-SiN$_x$:H layer during its initial growth.
5. Carrying on the steps 1-4 successively, the transformation of the ordinary pin structure would be accomplished and strong visible light shall be emitted through the whole diode surface.

During our laboratory studies, the experiments proved that the LED produced by this method can be fabricated not only in the form of plates emitting light of a specific color but also as the alphanumeric display systems together with the traffic indicators.

Nowadays, such a product is already required in various places. For instance, the "Emergency Exit" indicators are produced from Plexiglas painted by semitransparent colors and illuminated by a light source from its sides. Also, the numbers and the indicators on the road signs are produced by placing (or deploying) the crystalline small LEDs one by one. Instead, such systems may be replaced by LEDs according to this invention which can be fabricated and patterned over very large surfaces.

Besides, the possibility of fabrication along large plates at very low costs may render efficient lighting in both indoor and outdoor applications. Choosing the color of the emission as blue and/or yellowish, and covering the whole ceiling, uniform illumination would resemble the natural light.

This product would replace the suspended ceiling and/or floor tiles once its physical properties such as reliability, strength, weight are improved.

Since it is enough to change the nitrogen content of the intrinsic layer of the diode in order to adjust the emission color, lighting and display systems with the ability of emissions at different colors simultaneously can be fabricated to its final form without the deployment of the crystalline LEDs one by one.

The diode (LED) in the form of a plate is thin and light as a consequence of its structure. It is possible to use these diodes in the illumination of walls, ceilings, floors and tables, as they render uniform light emission at any specific color from the whole surface. By patterning electrical transport lines to connect different diodes within a plate, the diodes in the different sections of the plate can be adjusted to switch on and off at certain times.

The kind of the product to be commercialized first is thought to be those suitable for aesthetic usages. Therefore, plates laid or suspended like a painting will be produced in the first place. By the use of these plates, walls of a room either from end to end or a half-meter portion close to the ceiling will be illuminated.

For uniform and large area illumination with the present commercial LED systems, many point-like light sources are deployed densely and in large numbers, i.e. this deployment of the LEDs leads to a light emitting surface. In these systems, the point sources can be easily recognized by the human eye, hence, completely uniform illumination cannot be achieved.

Light emission of a certain color from the whole surface is preferable both for ease of reading and in terms of aesthetics.

Moreover, this fabrication method, technologically, offers a great advantage over its rivals, not only in terms aesthetics but also, considering the dimensions of our light source, with the low fabrication costs.

The invention cannot be restricted by the examples given above in order to clarify the subject. The invention is mainly as it is described in the requests.

The invention claimed is:
1. A method of manufacturing a light emitting diode for light emission from a large surface, the method comprising:
    coating of a 1 mm thick glass substrate with chromium;
    growing of p type doped hydrogenated nanocrystalline silicon (nc-Si:H) on the chromium coated glass by plasma enhanced chemical deposition (PECVD);
    depositing undoped (luminescent active region) amorphous silicon nitride (a SiNx:H) layer successively on an upper side of the p type, which makes this layer an i-type layer;
    growing of n type doped hydrogenated nanocrystalline silicon (nc-Si:H) on the upper side of the i-type layer;
    coating of ITO (Indium tin oxide) as a window electrode through which the emitted light will be extracted after an above four-layer structure is taken out of a PECVD reactor;
    applying a high forward bias voltage on a whole diode to get a transformation of a fabricated pin diode;
    wherein the step of depositing amorphous silicon nitride layer, an emission color is adjusted by changing a chemical concentrations and more specifically by changing the gas flow ratios;
    wherein the ITO is coated on the upper side of the n-type.

* * * * *